(12) United States Patent
Wakiyama et al.

(10) Patent No.: US 10,446,598 B2
(45) Date of Patent: Oct. 15, 2019

(54) SEMICONDUCTOR DEVICE, MANUFACTURING METHOD, AND ELECTRONIC APPARATUS

(71) Applicant: Sony Corporation, Tokyo (JP)

(72) Inventors: Satoru Wakiyama, Kanagawa (JP); Taizo Takachi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 16/113,886

(22) Filed: Aug. 27, 2018

(65) Prior Publication Data

US 2019/0013341 A1    Jan. 10, 2019

Related U.S. Application Data

(63) Continuation of application No. 15/454,560, filed on Mar. 9, 2017, now Pat. No. 10,084,003, which is a continuation of application No. 14/189,068, filed on Feb. 25, 2014, now Pat. No. 9,647,146.

(30) Foreign Application Priority Data

Mar. 8, 2013    (JP) .................................. 2013-046835

(51) Int. Cl.
    *H01L 27/146*    (2006.01)
    *H01L 31/041*    (2014.01)
    *H01L 31/0216*   (2014.01)
    *H01L 31/18*     (2006.01)

(52) U.S. Cl.
    CPC .. *H01L 27/14618* (2013.01); *H01L 27/14632* (2013.01); *H01L 27/14685* (2013.01); *H01L 31/02165* (2013.01); *H01L 31/041* (2014.12); *H01L 31/18* (2013.01); *H01L 2224/13* (2013.01); *H01L 2224/94* (2013.01); *Y02E 10/50* (2013.01)

(58) Field of Classification Search
    CPC .................................................... H01L 27/146
    See application file for complete search history.

(56) References Cited

U.S. PATENT DOCUMENTS 6,613,811 B1 *  9/2003  Pallaver ................... C08J 9/122
                                                      521/134
9,647,146 B2 *  5/2017  Wakiyama ............ H01L 31/041

FOREIGN PATENT DOCUMENTS

JP     2006137368 A  *  6/2006
JP     2007173586 A  *  7/2007
JP     2012049400 A  *  3/2012

* cited by examiner

*Primary Examiner* — Marvin Payen
(74) *Attorney, Agent, or Firm* — Sheridan Ross P.C.

(57) ABSTRACT

A method of manufacturing a semiconductor device includes: forming, on a cover glass, a film having a predetermined specific gravity and configured to shield an alpha ray that arises from the cover glass; and bonding the cover glass on which the film is formed and an image pickup device, by filling a transparent resin between the cover glass and the image pickup device.

20 Claims, 6 Drawing Sheets

(A)
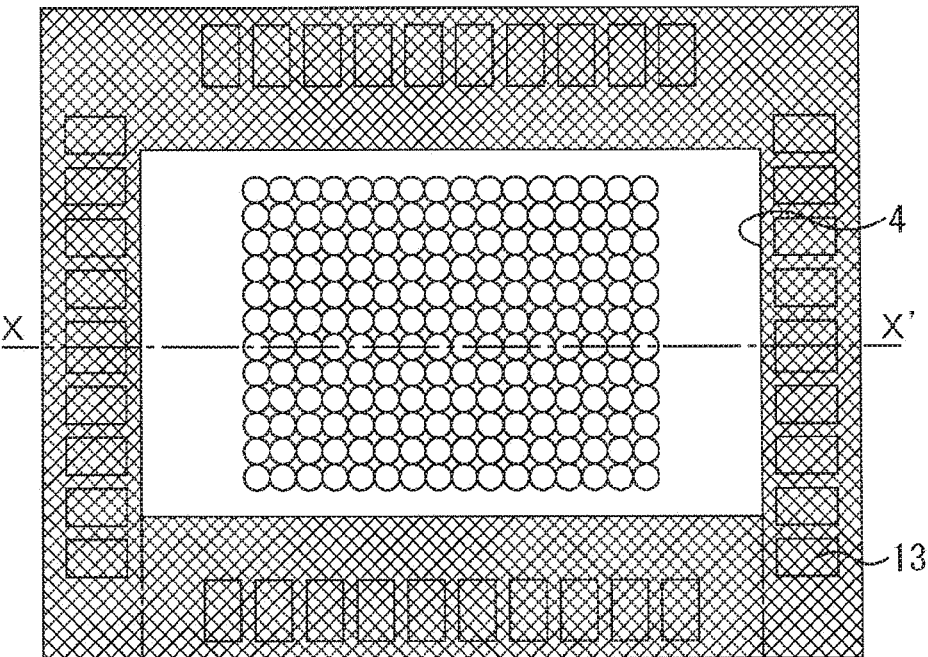
(B)
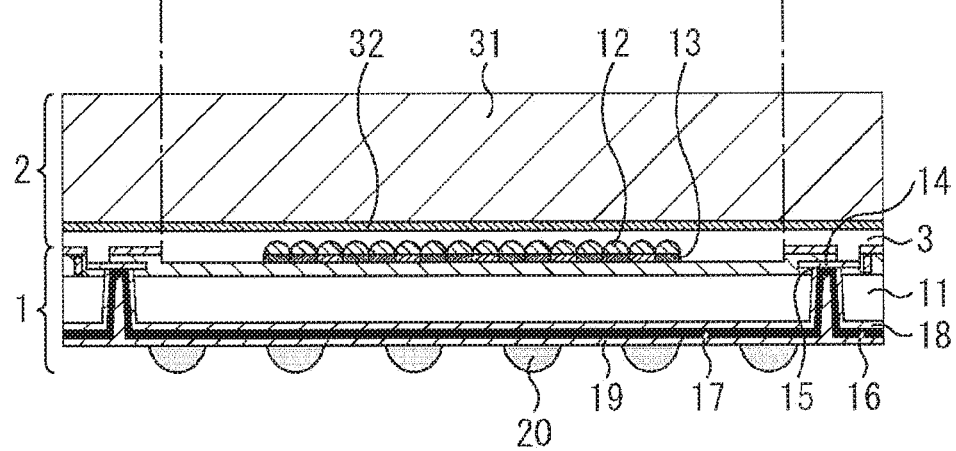
FIG. 1

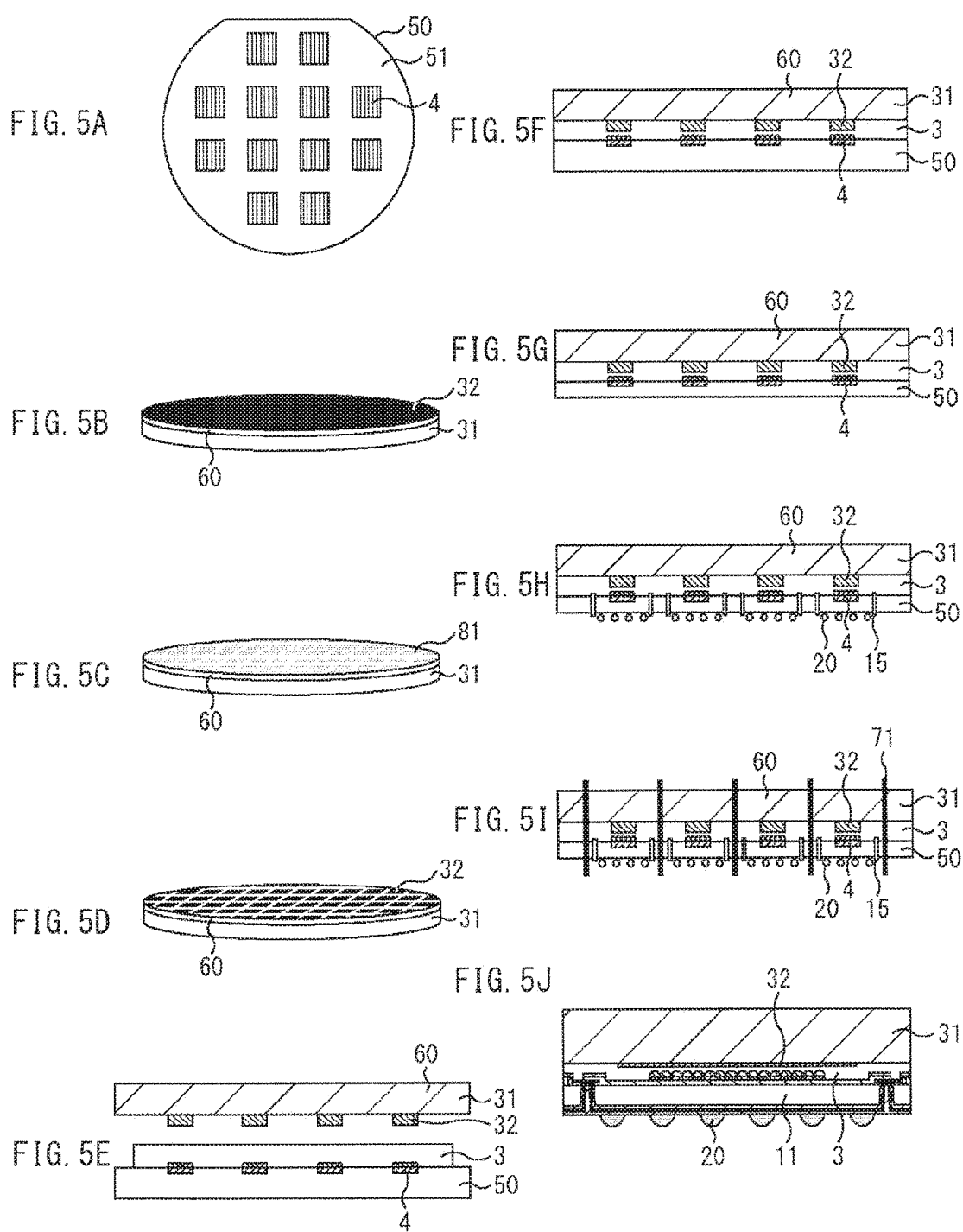

SEMICONDUCTOR DEVICE, MANUFACTURING METHOD, AND ELECTRONIC APPARATUS

CROSS REFERENCE TO RELATED APPLICATIONS

The present application is a continuation of U.S. patent application Ser. No. 15/454,560, filed Mar. 9, 2017, which is a continuation application of U.S. patent application Ser. No. 14/189,068, filed Feb. 25, 2014, now U.S. Pat. No. 9,647,146, which claims the benefit of Japanese Priority Patent Application JP 2013-046835 filed on Mar. 8, 2013, the entire contents of which are incorporated herein by reference.

BACKGROUND

The present technology relates to a semiconductor device, a manufacturing method, and an electronic apparatus. More specifically, the technology relates to a semiconductor device, a manufacturing method, and an electronic apparatus that reduce an influence of an alpha ray that arises in a cover glass.

For an image pickup device, a configuration is known that encapsulates an image pickup device chip, which is diced into an individual piece, from a wafer in the inside using a ceramic or plastic package having a concave portion and a cover member. In such an image pickup device, it has been found that, when glass is used as a cover member, an alpha ray which is emitted from heavy metals contained in the glass has an adverse effect on the characteristics of the image pickup device chip. In Japanese Unexamined Patent Application Publication Nos. 2012-49400, 2006-137368, and 2007-173586, a structure for alleviating the influence of the alpha ray on the image pickup device has been proposed.

Further, a WL-CSP (Wafer Level Chip-Size Package) is known that fixes a semiconductor substrate having an image pickup device in a wafer form and a light-transmissive substrate to dice such substrates into individual chip pieces. For an image pickup device fabricated based on WL-CSP, a batch processing at a wafer level is possible, and thus reduction of manufacturing costs, as well as the manufacturability of further small-sized and thin image pickup device are expected.

SUMMARY

Japanese Unexamined Patent Application Publication No. 2012-49400 has proposed to prevent an image pickup white spot defect that is caused due to the influence of an alpha ray by forming an alpha-ray-shielding film on a cover glass. In Japanese Unexamined Patent Application Publication No. 2012-49400, the alpha-ray-shielding film is bonded against the glass with a transparent adhesive, and thus in a case of a structure of bonding an Si wafer and a cover glass wafer like the WL-CSP in particular, it is necessary to bond the alpha-ray-shielding films individually on cover glasses corresponding to respective pixel sections. Such a technology involves a process for bonding the alpha-ray-shielding films individually on the cover glasses corresponding to the respective pixel sections, posing a possibility of an increase in length of time of an overall process.

Further, in the image pickup device disclosed in Japanese Unexamined Patent Application Publication No. 2012-49400, a hollow structure is formed on the image pickup device, and thus in a case of producing the WL-CSP exceeding 10 mm in size, especially in a case of producing a through electrode at the image pickup device side, an Si portion of the image pickup device is reduced in thickness. As a result, there is a possibility that the reliability will deteriorate because the image pickup device may be easily damaged.

Japanese Unexamined Patent Application Publication No. 2006-137368 has proposed to reduce the influence of an alpha ray by setting a thickness of a transparent adhesive to 20 μm or more in a Cavityless WL-CSP that adopts a structure in which an image pickup device and a cover glass are bonded with one another with the transparent adhesive.

In the Japanese Unexamined Patent Application Publication No. 2006-137368, an increase in the thickness of the transparent adhesive may raise the amount of warpage in a thermal history during a manufacturing process, which may pose an issue of concern for a defect during a backside wiring process, wafer cracking, and detachment between the transparent resin and the cover glass or the image pickup device. Further, it is difficult to reduce the transparent adhesive in thickness, which makes it difficult to achieve the reduction in thickness of CSP.

Japanese Unexamined Patent Application Publication No. 2007-173586 has proposed a structure for shielding of an alpha ray in such a manner that an oxide film is formed at the image pickup device side, and this is bonded with a cover glass using a transparent resin. In the Japanese Unexamined Patent Application Publication No. 2007-173586, because a patterning is not performed after forming the oxide film, the amount of warpage of an image pickup device section increases and a thickness of the oxide film that is allowed to be formed is limited, which makes it difficult to reduce the transparent resin in thickness. Further, because the oxide film is formed at the CIS side, the oxide film to be formed is limited to the oxide film that is allowed to be formed at low temperature.

It is desirable to provide a technology that allows an influence of an alpha ray to be reduced.

According to an embodiment of the present technology, there is provided a semiconductor device including: an image pickup device; a cover glass, the image pickup device and the cover glass being bonded to one another; a film provided between the image pickup device and the cover glass, the film having a predetermined specific gravity and configured to shield an alpha ray that arises from the cover glass; and a transparent resin filled between the image pickup device and the cover glass.

Advantageously, the following Expression may be satisfied:

$$AX+BY \geq C \text{ (in μm)}$$

where a thickness of the film is A in μm, a thickness of the transparent resin is B in μm, the specific gravity of the film is X, a specific gravity of the transparent resin is Y, and a distance between the cover glass and an imaging surface of the image pickup device is C, the distance being calculated as a distance necessary to reduce an influence of the alpha ray on the basis of a range of the alpha ray emitted from uranium contained in the cover glass.

Advantageously, the film may be formed on the cover glass.

Advantageously, the film may be formed only at a region corresponding to portions where pixels of the image pickup device are provided.

In the semiconductor device according to any of the above-described embodiments of the present technology, the image pickup device and the cover glass are so provided that the film having a predetermined specific gravity and the transparent resin are filled. The film has a function of shielding the alpha ray arising from the cover glass.

According to an embodiment of the present technology, there is provided a method of manufacturing a semiconductor device, the method including: forming, on a cover glass, a film having a predetermined specific gravity and configured to shield an alpha ray that arises from the cover glass; and bonding the cover glass on which the film is formed and an image pickup device, by filling a transparent resin between the cover glass and the image pickup device.

Advantageously, the film may be formed to have a thickness that satisfies the following Expression:

$AX+BY \geq C$ (in μm)

where the thickness of the film is A in μm, a thickness of the transparent resin is B in μm, the specific gravity of the film is X, a specific gravity of the transparent resin is Y, and a distance between the cover glass and an imaging surface of the image pickup device is C, the distance being calculated as a distance necessary to reduce an influence of the alpha ray on the basis of a range of the alpha ray emitted from uranium contained in the cover glass.

Advantageously, the method may further include, after the forming the film on the cover glass, removing the film at a portion corresponding to a scribing line.

In the manufacturing method according to any of the above-described embodiments of the present technology, the semiconductor device is manufactured by forming, on the cover glass, the film having a predetermined specific gravity and having a function of shielding the alpha ray arising from the cover glass; and bonding the cover glass on which the film is formed and the image pickup device by filling the transparent resin.

According to an embodiment of the present technology, there is provided an electronic apparatus provided with a semiconductor device and a signal processing section. The signal processing section is configured to perform a signal processing for a pixel signal outputted from the semiconductor device. The semiconductor device includes: an image pickup device; a cover glass, in which the image pickup device and the cover glass are bonded to one another; a film provided between the image pickup device and the cover glass, in which the film has a predetermined specific gravity and configured to shield an alpha ray that arises from the cover glass; and a transparent resin filled between the image pickup device and the cover glass.

In the electronic apparatus according to the above-described embodiment of the present technology, the semiconductor device and the signal processing section are included. The image pickup device and the cover glass are so provided that the film having a predetermined specific gravity and the transparent resin are filled. The film has a function of shielding the alpha ray arising from the cover glass. The signal processing section is configured to perform a signal processing for a pixel signal outputted from such a semiconductor device.

According to the above-described embodiments of the present technology, it is possible to reduce an influence of an alpha ray.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the present disclosure, and are incorporated in and constitute a part of this specification. The drawings illustrate embodiments and, together with the specification, serve to explain the principles of the present technology.

(A) and (B) of FIG. 1 are each a schematic diagram showing a configuration of a semiconductor device according to a first embodiment of the present technology.

FIGS. 5A to 5J are each a schematic diagram for explaining a manufacturing process of the semiconductor device according to the second embodiment of the present technology.

DETAILED DESCRIPTION

Figure 2A:
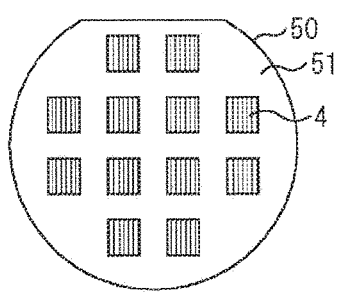
FIGS. 2A to 2H are each a schematic diagram for explaining a manufacturing process of the semiconductor device according to the first embodiment of the present technology.

Hereinafter, the description is provided on some embodiments of the present technology (hereinafter referred to as "embodiment(s)". The description is provided in the order given below.
1. Configuration of a semiconductor device according to a first embodiment
2. Manufacturing of the semiconductor device according to the first embodiment
3. Configuration of a semiconductor device according to a second embodiment
4. Manufacturing of the semiconductor device according to the second embodiment
5. Configuration of an image pickup apparatus
(Configuration of Semiconductor Device According to First Embodiment)

(A) and (B) of FIG. 1 are each a schematic diagram showing a configuration of a semiconductor device according to a first embodiment of the present technology. (A) of FIG. 1 is a perspective plan view of the semiconductor device, and (B) of FIG. 1 is a schematic cross-sectional view along X-X' line denoted in (A) of FIG. 1.

The semiconductor device has an image pickup device chip 1 having a pixel region 4, and a light-transmissive cover member 2 that is fixed to the image pickup device chip 1 through a fixing member 3. As described later, this semiconductor device is fabricated in such a manner that a semiconductor wafer and a light-transmissive substrate are fixed with one another by means of the fixing member 3, and thereafter are diced into individual chip pieces. The image pickup device chip 1 may be, for example, a CMOS (Complementary Metal Oxide Semiconductor) image sensor, a CCD (Charge Coupled Device) image sensor, or the like. The pixel region 4 has a plurality of conversion elements for converting incident light into charges as well as a plurality of transistors.

On a semiconductor substrate 11 of the image pickup device chip 1, there are arranged microlenses 12 and a color filter 13. On the underside of the semiconductor substrate 11 (opposite side of light incidence side), there are arranged a conductive film 16, an insulating film 18, and an insulating member 19. A material such as Al (aluminum) or Cu (copper) may be used for the conductive film 16, and a material such as an oxide film or a nitride film may be used for the insulating film 18 may use. Further, a material such as a solder resist may be used for the insulating member 19.

The image pickup device chip 1 has a through electrode 15 that runs through a first principal surface on the light-transmissive cover member side that is the light incidence side of the semiconductor substrate 11 and a second principal surface on the opposite side of the first principal surface. The through electrode 15 is configured by a part of the conductive film 16. The through electrode 15 is electrically connected with a surface electrode 14 within a wiring structure. Further, for electrical connection with a circuit substrate that is not shown in the drawing, the image pickup device chip 1 has a wire 17 that is configured by a part of the conductive film 16.

Additionally, the image pickup device chip 1 has connection terminals 20 for connection with an external circuit that are electrically connected with the wire 17 arranged on the opposite side of the light-transmissive cover member 2. A solder ball is used for each of the connection terminals 20 in this example, although an anisotropic conductive member such as an ACP (Anisotropic Conductive Paste) or an ACF (Anisotropic Conductive Film) may be used for the connection terminals 20. A silicon substrate is used for a CMOS image sensor as the image pickup device chip 1.

The light-transmissive cover member 2, for which a configuration after a light-transmissive substrate is diced into individual chip pieces is illustrated in the drawing, has a cover glass 31 and an oxide film 32. When the amount of an alpha ray emitted from the light-transmissive cover member 2 is greater than a predetermined value, it is likely that this will cause a malfunction of the image pickup device chip 1 or deterioration in the image quality, and thus it is necessary to reduce the emission amount of the alpha ray. Accordingly, as the light-transmissive cover member 2, the cover glass 31 and the oxide film 32 that is for reducing radiation of the alpha ray onto the image pickup device chip 1 are used in combination with one another. The oxide film 32 functions as an alpha ray shielding film.

As described with reference to FIGS. 2A to 2H, the oxide film 32 is configured on the cover glass 31. In the first embodiment of the present technology, the description is provided on the assumption that the oxide film 32 with the area equivalent to that of the cover glass 31 is provided on the cover glass 31. More specifically, in (B) of FIG. 1, the oxide film 32 is provided on the cover glass 31 seamlessly.

(Manufacturing of Semiconductor Device According to First Embodiment)

Next, a method of manufacturing the semiconductor device illustrated in (A) and (B) of FIG. 1 is described using FIGS. 2A to 2H. It is to be noted that FIGS. 2A to 2H are simplified as compared with (A) and (B) of FIG. 1.

First, as shown in FIG. 2A, a plurality of pixel regions and the like illustrated in (A) and (B) of FIG. 1 are formed on a substrate 51 that is configured of a silicon single crystal, to prepare a semiconductor wafer 50 having the plurality of pixel regions 4. The pixel regions and the like may be formed using a semiconductor device manufacturing process.

Figure 2B:

As shown in FIG. 2B, a light-transmissive substrate 60 is manufactured by forming the oxide film 32 on the cover glass 31. The cover glass 31 may preferably exhibit the linear expansion behavior with respect to temperature similar to that of Si (substrate 51 that is formed of a silicon single crystal) to the extent possible. Examples of such cover glass 31 may include quartz glass, borosilicate glass, and the like.

The oxide film 32 is formed by adopting a film-forming method, such as CVD (Chemical Vapor Deposition) using P-SiO, SOG, and TEOS that contain no radioactive elements including uranium, or SOG (Spin On Glass). The film-forming method of the oxide film 32 may preferably be a method that allows formation of the oxide film 32 at a predetermined thickness. Further, any oxide film that is allowed to be formed in a method such as the CVD and spin coating may be applicable as the oxide film 32.

Additionally, a material having a specific gravity of a value equal to or greater than a predetermined value, for example, about two or more is used for the oxide film 32. Use of the oxide film 32 having the high specific gravity material makes it possible to shield the alpha ray efficiently. Such an efficient shielding capability of the alpha ray allows shielding of the alpha ray even with the thin oxide film 32, which makes it possible to reduce the oxide film 32 in thickness. Further, reduction in thickness of the oxide film 32 enables the semiconductor device itself (CSP) to be reduced in thickness.

A thickness of the oxide film 32 may be determined based on a relationship with a thickness of the fixing member 3 (for which a transparent resin or the like may be used as described hereinafter). Even if the oxide film 32 is not provided, it is possible to reduce the influence of the alpha ray on the image pickup device by increasing a thickness of the fixing member 3 to increase a distance between the cover glass 31 and the image pickup device (or the microlenses 12).

Accordingly, it is possible to reduce the influence of the alpha ray emitted from the cover glass 31 on the image pickup device by adjusting the thickness of the oxide film 32 and the thickness of the fixing member 3. Here, when a thickness of the oxide film 32 is A (in μm), a thickness of the fixing member 3 (transparent resin that bonds the image pickup device and the cover glass 31) is B (in μm), a specific gravity of the oxide film 32 is X, and a specific gravity of the fixing member 3 is Y, the following Expression is established for a distance C between the cover glass 31 and an imaging surface of the image pickup device.

$$AX+BY \geq C \text{ (in μm)}$$

When the sum of a value obtained by multiplying the thickness of the oxide film 32 by the specific gravity of the oxide film 32 and a value obtained by multiplying the thickness of the fixing member 3 by the specific gravity of the fixing member 3 is greater than the predetermined value C, it is possible to reduce the influence of the alpha ray emitted from the cover glass 31 because such an influence does not reach the imaging surface of the image pickup device.

The distance C is defined as a value calculated as a distance necessary for preventing an image pickup white spot defect caused by the alpha ray emitted from the cover glass 31, on the basis of a range of the alpha ray emitted from uranium contained in the cover glass 31, for example. Based on this relational expression, when the thickness and the specific gravity of the fixing member 3 are each set to have a fixed value, it will be appreciated that the oxide film 32 is allowed to be reduced in thickness when the specific gravity of the oxide film 32 is large. Further, obviously, it will also be appreciated that provision of the oxide film 32 allows the fixing member 3 to be reduced in thickness more as compared with a case of provision of only the fixing member 3.

In such a manner, by increasing the thickness of the oxide film having the specific gravity typically higher than that of a resin, it is possible to reduce a thickness of a transparent resin (thickness of the fixing member 3), leading to reduction in thickness of the CSP.

It is to be noted that the thickness of the oxide film 32 may not be calculated only from the above relational expression, but may be calculated based on any other expression.

Figure 2C:
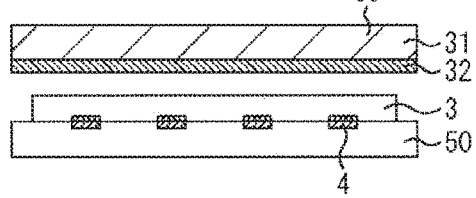
Figure 2D:
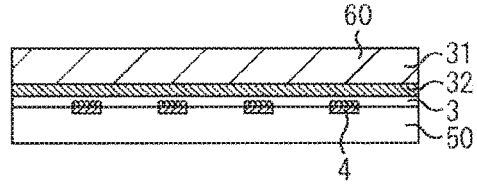

Referring back to the description with respect to FIGS. 2A to 2H, as illustrated in FIG. 2C and FIG. 2D, the semiconductor wafer 50 and the light-transmissive substrate 60, which is manufactured to have a size about the same size as the semiconductor wafer 50, are overlapped with one another to be fixed. The semiconductor wafer 50 and the light-transmissive substrate 60 are fixed with the fixing member 3. A liquid adhesive may be used for the fixing member 3. Further, for example, a transparent resin may be used for the fixing member 3, and the transparent resin may be hardened to fix (bond) the semiconductor wafer 50 and the light-transmissive substrate 60.

For a transparent adhesive as the fixing member 3, silicon resin, acrylic resin, epoxy resin, dendrimer, or copolymer thereof may be selected. Such a selection ensures that any disadvantage in terms of the heat resistance/chemical resistance/light resistance is not caused in a process subsequent to bonding of the semiconductor wafer 50 and the light-transmissive substrate 60 (for example, a heat-based or UV-irradiation-based hardening treatment) or also in a reliability test, and that the image pickup characteristics are not influenced.

Further, use of a transparent resin that enables formation of a resin film in a coating or lamination method on the semiconductor wafer 50 side or on the cover glass 31 side where the oxide film 32 is formed, and capable of performing bonding of the image pickup device or the cover glass 31 on which the oxide film 32 is formed in a semi-hardened state makes it possible to prevent protrusion of resin to a wafer edge or generation of a resin void during the bonding process.

In this manner, the light-transmissive substrate 60 on which the oxide film 32 is formed is overlapped with the semiconductor wafer 50 on the cover glass 31. A surface to be overlapped with the semiconductor wafer 50 is a surface on which the oxide film 32 is provided.

Figure 2E:
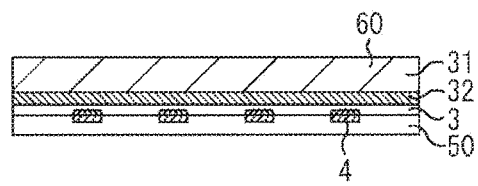

As shown in FIG. 2E, the semiconductor wafer 50 is reduced in thickness. As a method for reducing the thickness, one or more of backgrinding, CMP (Chemical Mechanical Polishing), and etching methods may be selected. On this occasion, the semiconductor wafer 50 is reduced in thickness as far as a state where formation of the through electrode is allowed in a subsequent-stage process. As illustrated in FIG. 2E, in the state where the semiconductor wafer 50 is reduced in thickness, a space between the cover glass 31 and the image pickup device is not of a hollow structure because the oxide film 32 and a transparent resin (fixing member 3) are filled between the cover glass 31 and the image pickup device.

Therefore, in a case of a hollow structure, the strength deteriorates in the hollow structure portion, resulting in degradation in the reliability. However, it is possible to avoid such a disadvantage, and to achieve a thin WL-CSP that assures the high reliability.

Figure 2F:
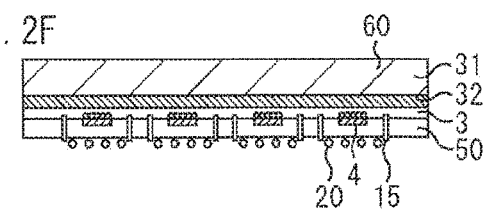

As shown in FIG. 2F, the through electrode 15 is formed on the semiconductor wafer 50. For the through electrode 15, a through hole is formed by etching to open a wiring portion of multi-layer wiring (not shown in the drawing) that is formed on the surface of the semiconductor wafer. Subsequently, an insulating film such as a silicon oxide film is formed, and the insulating film inside the through hole is opened by etching. Thereafter, the through electrode is formed inside the through hole by means of, for example, Cu plating, and the wiring is formed on the surface (backside) at the opposite side of the light-transmissive substrate of the semiconductor wafer. Afterward, a solder resist as an insulating member is formed at the backside of the semiconductor wafer, and an aperture is formed on the wiring to form solder balls as the connection terminals 20.

Figure 2G:
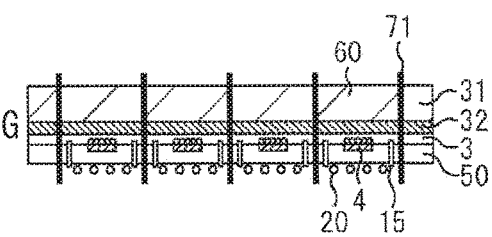

As shown in FIG. 2G, the semiconductor wafer 50 and the light-transmissive substrate 60 that are integrated with one another are diced into individual chip pieces. In FIG. 2G, a reference numeral 71 denotes a dicing position. As a dicing method, blade dicing, laser dicing, and the like may be used. The laser dicing may be a preferable method because this is excellent in the machining performance for the semiconductor wafer that is reduced in thickness, and this makes it possible to reduce a dicing width as well as to prevent generation of burr of a dicing surface.

Figure 2H:
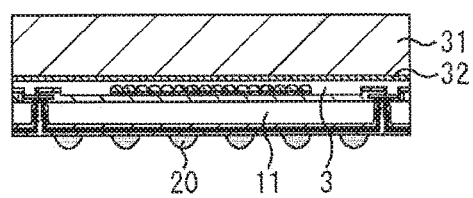

As shown in FIG. 2H, the processes as described above complete the semiconductor device.

Figure 3:
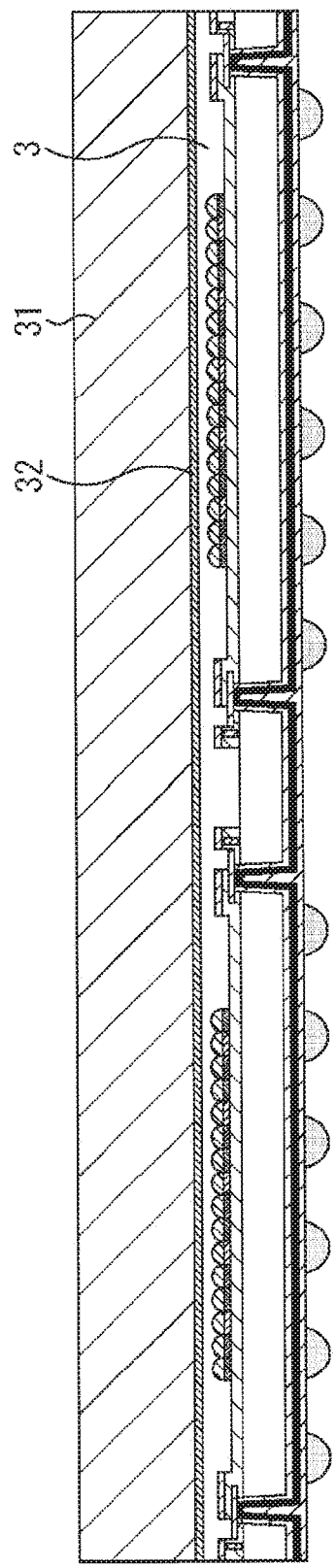
FIG. 3 is a side view showing a configuration in the manufacturing process of the semiconductor device.

FIG. 3 shows a side view of the semiconductor wafer 50 and the light-transmissive substrate 60 that are integrated with one another before being diced into individual chip pieces, and is a schematic diagram extracting two semiconductor devices from the semiconductor wafer 50 and the light-transmissive substrate 60 that are integrated with one another as illustrated in FIG. 2G. As shown in FIG. 3, the cover glass 31 and the oxide film 32 are arranged in this order from the top, and the light-transmissive substrate 60 is integrated with the semiconductor wafer 50 through the fixing member 3. The oxide film 32 is provided as a layer seamlessly between the cover glass 31 and the fixing member 3. Accordingly, when the integrated semiconductor wafer 50 and the light-transmissive substrate 60 having such an oxide film 32 are diced into individual chip pieces, the form thereof is as shown in (B) of FIG. 1.

The oxide film 32 makes it possible to prevent the alpha ray arising in the cover glass 31 from reaching the imaging surface of the image pickup device. For example, it is possible to reduce the likelihood that a drawback such as a white spot defect will be caused by the alpha ray. Further, use of low-alpha-ray glass may be contemplated to reduce the influence of the alpha ray, although the oxide film 32 is allowed to be provided more inexpensively than the low-alpha-ray glass, resulting in the cost reduction being achieved. Additionally, the low-alpha-ray glass makes it difficult to adjust the linear expansion coefficient to that of silicon (Si) at the image pickup device side. In contrast, the method of providing the oxide film 32 on the cover glass 31 makes it easy to adjust the linear expansion coefficient to that of the silicon at the image pickup device side.

Further, if the cover glass 31 and the semiconductor wafer 50 are integrated with one another without providing the oxide film 32, it is difficult to reduce the influence of the alpha ray unless the fixing member 3 is increased in thickness. More specifically, in a case of a structure without providing the oxide film 32, it is necessary to reduce the influence of the alpha ray by increasing the thickness of the fixing member 3, which makes it difficult to achieve the thin semiconductor device. On the contrary, the structure of providing the oxide film 32 makes it possible to achieve the thin semiconductor device.

(Configuration of Semiconductor Device According to Second Embodiment)

In the first embodiment of the present technology, the description is provided by taking as an example a case where the oxide film 32 is provided on the cover glass 31 seamlessly, in other words, a case where the oxide film 32 is provided over the whole surface of the cover glass 31. In the second embodiment of the present technology, the description is provided by taking as an example a case where the oxide film 32 is provided in a state in which the oxide film 32 has a seam partially on the cover glass 31, in other words, a state in which the oxide film 32 is partially removed on the cover glass 31.

Figure 4A:
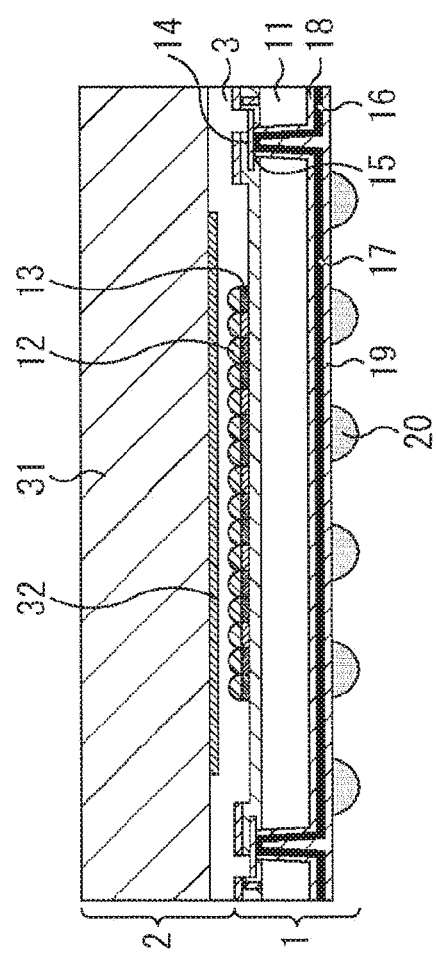
FIGS. 4A and 4B are each a schematic diagram showing a configuration of a semiconductor device according to a second embodiment of the present technology.
Figure 4B:
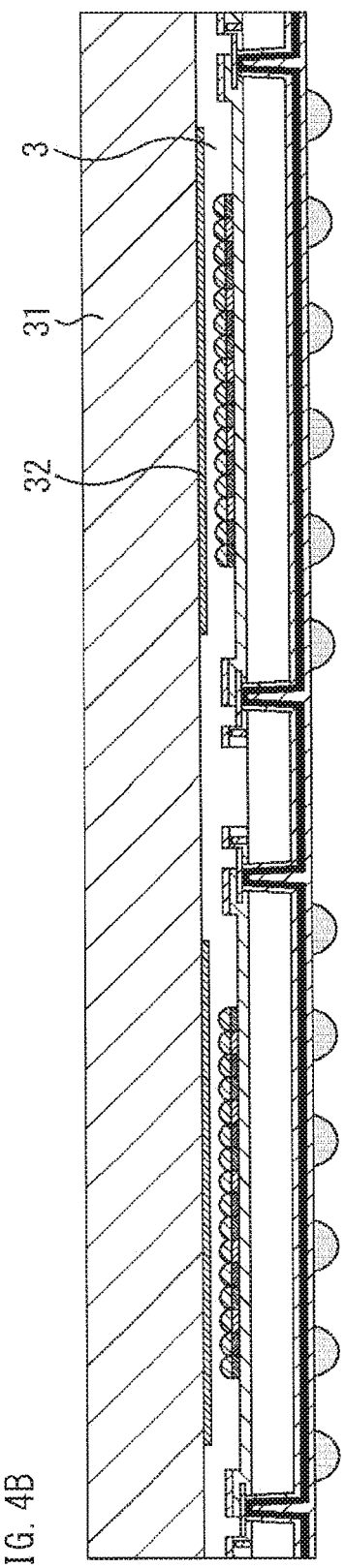

FIGS. 4A and 4B are each a schematic diagram showing a configuration of a semiconductor device according to the second embodiment of the present technology. FIG. 4A corresponds to the semiconductor device illustrated in (B) of FIG. 1, and is a schematic diagram showing a configuration of a single semiconductor device. The semiconductor device illustrated in FIG. 4A is different from the semiconductor device illustrated in (B) of FIG. 1 in that the oxide film 32 is not provided in the vicinity of a location of the through electrode 15 in the semiconductor device illustrated in FIG. 4A.

FIG. 4B corresponds to the semiconductor device illustrated in FIG. 3. FIG. 4B is a schematic diagram showing a configuration of two consecutive semiconductor devices before they are diced into individual chip pieces. As shown in FIG. 4B, the oxide film 32 is not provided at a portion of a scribing line (mark-off line). In other words, the oxide film 32 is not provided at a portion other than a pixel region of the semiconductor device.

Further, in other words, with reference to (A) of FIG. 1, a structure is adopted where the oxide film 32 is provided at a portion corresponding to the pixel region 4, but the oxide film 32 is not provided at a portion corresponding to any portion other than the pixel region 4 (the oxide film 32 is removed during a manufacturing process as described later).

As described above, by providing a region where the oxide film 32 is not provided partially instead of providing the oxide film 32 continuously, it is possible to reduce the warpage of the cover glass 31.

(Manufacturing of Semiconductor Device According to Second Embodiment)

Next, a method of manufacturing the semiconductor devices illustrated in FIGS. 4A and 4B is described using FIGS. 5A to 5J. It is to be noted that FIGS. 5A to 5J are simplified as compared with FIGS. 4A and 4B.

The manufacturing method illustrated in FIGS. 5A to 5J is the same in basic flow as the manufacturing method described with reference to FIGS. 2A to 2H with the exception of additional steps illustrated in FIG. 5C and FIG. 5D. Therefore, the description that overlaps with the description with reference to FIGS. 2A to 2H is omitted as appropriate.

First, as shown in FIG. 5A, the semiconductor wafer 50 having the plurality of pixel regions 4 is prepared on the substrate 51 that is formed of a silicon single crystal. As shown in FIG. 5B, the light-transmissive substrate 60 is manufactured by forming the oxide film 32 on the cover glass 31. In this process, the oxide film 32 is formed over a whole surface at one side of the light-transmissive substrate 60.

As shown in FIG. 5C, a resist 81 is coated on the cover glass 31 on which the oxide film 32 is formed, and the patterning is performed. By carrying out the patterning by the use of, for example, a photoresist, the light-transmissive substrate 60 in which the oxide film 32 on the scribing line (line having a predetermined width that is centered on the scribing line) is removed is manufactured as shown in FIG. 5D.

FIG. 5E to FIG. 5J are the same as FIG. 2C to FIG. 2H, and thus the description thereof is omitted.

In such a manner, by adding the process for removing the oxide film 32, it is possible to provide the oxide film 32 at a portion involving use of the oxide film 32 and removing the oxide film 32 at a portion not involving use of the oxide film 32. A portion involving use of the oxide film 32 may be, for example, a region within the pixel region 4, and a portion of the cover glass 31 corresponding to a portion where the microlenses 12 are located.

By providing the portion where the oxide film 32 is removed, it is possible to reduce the generation of the warpage. For example, it is possible to reduce even the warpage arising when the oxide film 32 with a relatively larger thickness is formed on the cover glass 31.

By forming the oxide film 32 to have a larger thickness, it is possible to reduce the influence of the alpha ray even when the oxide film 32 having a small specific gravity is used. Further, depending on a material used for the oxide film 32, a predetermined thickness may be necessary for full effectiveness. In such a case, even though there is a possibility of occurrence of the warpage, removal of a part of the oxide film 32 allows generation of the possible warpage to be reduced.

Because removal of a part of the oxide film 32 allows the warpage to be reduced, it is possible to use the oxide film 32 with an inexpensive material, the oxide film 32 having a small specific gravity, or the oxide film 32 suitable for manufacturing. As a result, this makes it possible to broaden the range of choice for the oxide film 32.

By carrying out a patterning after forming the oxide film 32 on the cover glass 31, it is possible to reduce the amount of warpage of the cover glass 31 that is caused due to formation of the oxide film 32. Further, this also makes it possible to prevent a defect during a bonding process of the cover glass 31 and the image pickup device, a defect during a backside wiring process, wafer cracking, and the like. Moreover, it is possible to prevent detachment between the transparent resin (fixing member 3) and the cover glass 31 as well as detachment between the fixing member 3 and the image pickup device.

Further, as described above, the bonding of the cover glass 31 to the semiconductor wafer 50 is performed after the oxide film 32 is formed on the cover glass 31 and a patterning is performed, which allows the oxide film 32 to be formed at high temperature, for example, at temperature of about 400 degrees centigrade or higher. For example, if the bonding of the semiconductor wafer 50 to the cover glass 31 is performed after the oxide film 32 is formed on the semiconductor wafer 50, the oxide film 32 is limited to an oxide film that is allowed to be formed at low temperature, because the heat resistance of the semiconductor wafer 50 is low and it is difficult to form the oxide film 32 at high temperature in consideration of the influence of temperature on the semiconductor wafer 50. In other words, limitation of the process temperature increases, which makes it difficult to form the oxide film having a large thickness in particular.

However, because the oxide film 32 is formed on the cover glass 31, it is possible to form the oxide film 32 at high temperature, and to use the oxide film that is allowed to be formed at high temperature, as well as to form a thick film. This allows the range of choice for usable materials of the oxide film to be broadened, which makes it possible to increase options for patterning methods and the like. In other words, according to an embodiment of the present technology, it is possible to reduce limitation of film-forming temperature and film-forming methods, thereby allowing a degree of freedom for the process to be raised.

Further, as with the first embodiment of the present technology, use of the oxide film 32 makes it possible to reduce the likelihood that a drawback such as a white spot defect will be caused by the alpha ray arising in the cover glass 31. Additionally, the oxide film 32 is allowed to be provided more inexpensively than the low-alpha-ray glass, resulting in the cost reduction being achieved. Moreover, the method of providing the oxide film 32 on the cover glass 31 makes it easier to adjust the linear expansion coefficient to that of the silicon at the image pickup device side.

Further, the structure of providing the oxide film 32 on the cover glass 31 achieves thin semiconductor device.

(Configuration of Image Pickup Apparatus)

The above-described semiconductor device is applicable to any electronic apparatus that uses semiconductor device for an image capture section (photoelectric conversion section), including an image pickup apparatus such as a digital still camera and a video camera, a mobile terminal apparatus having a built-in image pickup function such as a mobile phone, and a copier using an image pickup apparatus at an image scanner section.

Figure 6:
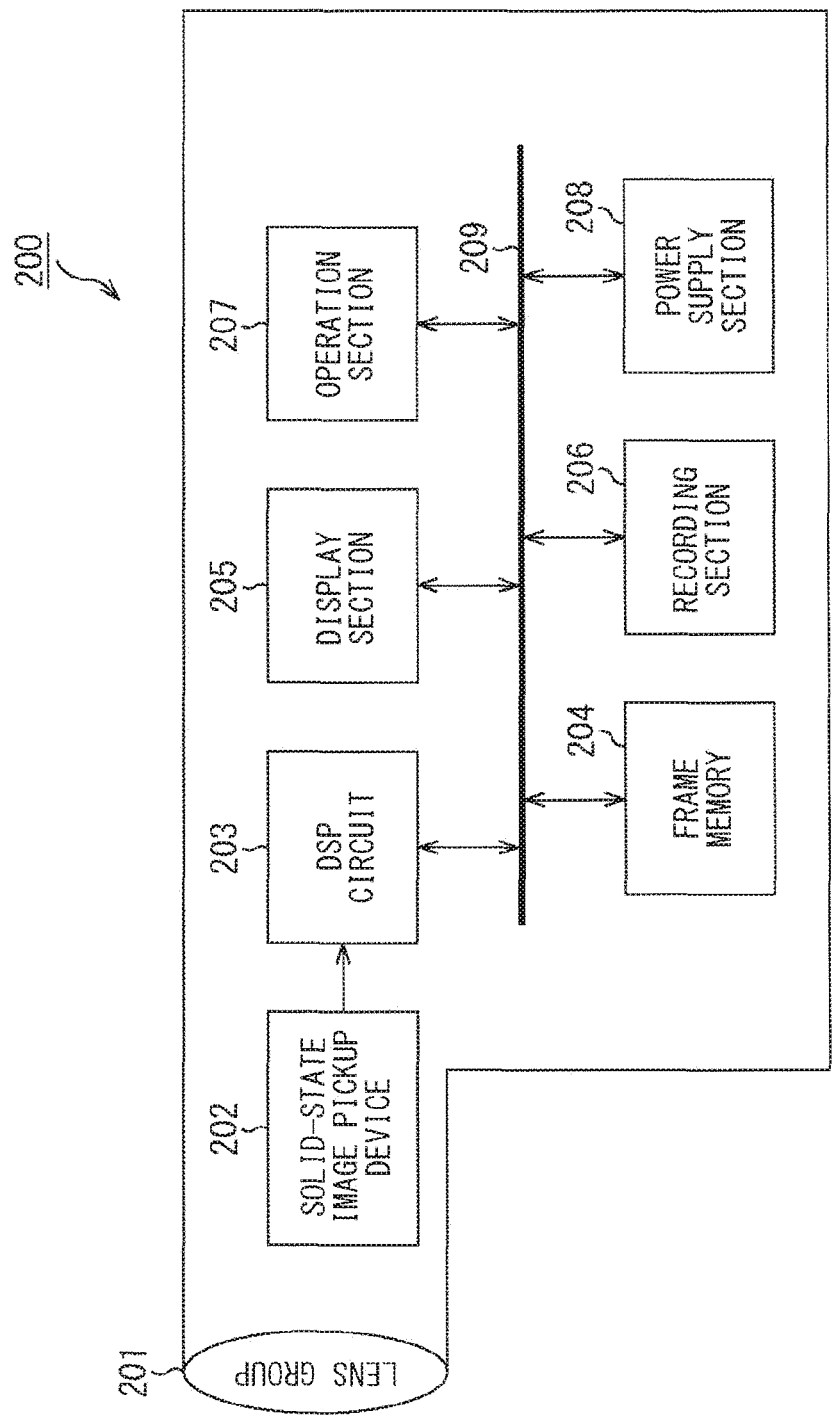
FIG. 6 is a schematic block diagram showing a configuration of an image pickup apparatus.

FIG. 6 is a schematic block diagram showing a configuration example of an electronic apparatus according to an embodiment of the present technology, for example, an image pickup apparatus. As shown in FIG. 6, an image pickup apparatus 200 according to an embodiment of the present technology has an optical system including a lens group 201 and the like, image pickup elements (image pickup device) 202, a DSP circuit 203, a frame memory 204, a display unit 205, a recording unit 206, an operation system 207, a power supply system 208, and the like. The DSP circuit 203, the frame memory 204, the display unit 205, the recording unit 206, the operation system 207, and the power supply system 208 are interconnected with each other via a bus line 209.

The lens group 201 captures incident light (image light) from a subject to form the image on an image pickup surface of the image pickup device 202. The image pickup device 202 converts the amount of the incident light that is imaged on the image pickup surface by the lens group 201 into an electrical signal on a pixel basis to output such a converted signal as a pixel signal.

The display unit 205 is configured of a panel-type display unit such as a liquid crystal display unit or an organic EL (Electro Luminescence) display unit, and displays moving images or still images that are imaged by the image pickup device 202. The recording unit 206 records the moving images or the still images that are imaged by the image pickup device 202 on a recording medium such as a video tape and a DVD (Digital Versatile Disk).

The operation system 207 issues operation commands for various functions that the image pickup apparatus has under an operation by a user. The power supply system 208 provides various power supplies as operation power supplies for the DSP circuit 203, the frame memory 204, the display unit 205, the recording unit 206, and the operation system 207 to these component parts as appropriate.

The image pickup apparatus that is configured as described above is applicable as the image pickup apparatus including a video camera and a digital still camera, as well as a camera module for a mobile apparatus such as a mobile phone. Further, in the image pickup apparatus, the above-described semiconductor device is usable as the image pickup device 202.

It is to be noted that the present technology is not limited to the above-described embodiments, but various modifications are available insofar as they are within the scope of the substance of the present technology.

Furthermore, the technology encompasses any possible combination of some or all of the various embodiments described herein and incorporated herein.

It is possible to achieve at least the following configurations from the above-described example embodiments of the disclosure.

(1) A semiconductor device, including:
an image pickup device;
a cover glass, the image pickup device and the cover glass being bonded to one another;
a film provided between the image pickup device and the cover glass, the film having a predetermined specific gravity and configured to shield an alpha ray that arises from the cover glass; and
a transparent resin filled between the image pickup device and the cover glass.

(2) The semiconductor device according to (1), wherein the following Expression is satisfied:

$$AX+BY \geq C \text{ (in } \mu m)$$

where a thickness of the film is A in μm, a thickness of the transparent resin is B in μm, the specific gravity of the film is X, a specific gravity of the transparent resin is Y, and a distance between the cover glass and an imaging surface of the image pickup device is C, the distance being calculated as a distance necessary to reduce an influence of the alpha ray on the basis of a range of the alpha ray emitted from uranium contained in the cover glass.

(3) The semiconductor device according to (1) or (2), wherein the film is formed on the cover glass.

(4) The semiconductor device according to any one of (1) to (3), wherein the film is formed only at a region corresponding to portions where pixels of the image pickup device are provided.

(5) A method of manufacturing a semiconductor device, the method including:
forming, on a cover glass, a film having a predetermined specific gravity and configured to shield an alpha ray that arises from the cover glass; and
bonding the cover glass on which the film is formed and an image pickup device, by filling a transparent resin between the cover glass and the image pickup device.

(6) The method according to (5), wherein the film is formed to have a thickness that satisfies the following Expression:

$$AX+BY \geq C \text{ (in } \mu m)$$

where the thickness of the film is A in μm, a thickness of the transparent resin is B in μm, the specific gravity of the film is X, a specific gravity of the transparent resin is Y, and a distance between the cover glass and an imaging surface of the image pickup device is C, the distance being calculated as a distance necessary to reduce an influence of the alpha ray on the basis of a range of the alpha ray emitted from uranium contained in the cover glass.

(7) The method according to (5) or (6), further including, after the forming the film on the cover glass, removing the film at a portion corresponding to a scribing line.

(8) An electronic apparatus provided with a semiconductor device and a signal processing section, the signal processing section being configured to perform a signal processing for a pixel signal outputted from the semiconductor device, the semiconductor device including:
an image pickup device;

a cover glass, the image pickup device and the cover glass being bonded to one another;

a film provided between the image pickup device and the cover glass, the film having a predetermined specific gravity and configured to shield an alpha ray that arises from the cover glass; and a transparent resin filled between the image pickup device and the cover glass.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor device, comprising:
an image pickup device;
a cover glass, wherein the image pickup device and the cover glass are bonded to one another;
a film provided between the image pickup device and the cover glass, wherein the film has a specific gravity value of two or more and is configured to shield an alpha ray that arises from the cover glass; and
a transparent resin filled between the image pickup device and the cover glass,
wherein the film is configured to cover an area of the transparent resin within a pixel region, and wherein the film is not provided at a portion other than the pixel region.

2. The semiconductor device according to claim 1, wherein the following Expression is satisfied:

$$AX+BY \geq C \text{ (in } \mu m\text{)}$$

where a thickness of the film is A in μm, a thickness of the transparent resin is B in μm, the specific gravity of the film is X, a specific gravity of the transparent resin is Y, and a distance between the cover glass and an imaging surface of the image pickup device is C, wherein the distance is calculated as a distance at which an influence of the alpha ray based on a range of the alpha ray emitted from uranium contained in the cover glass is reduced.

3. The semiconductor device according to claim 1, wherein the portion at which the film is not provided includes a scribing line portion.

4. The semiconductor device according to claim 1, wherein the film has a seam partially on the cover glass.

5. The semiconductor device according to claim 1, wherein the film is an oxide film.

6. A method of manufacturing a semiconductor device, the method comprising:
forming, on a cover glass, a film that has a specific gravity value of two or more and is configured to shield an alpha ray that arises from the cover glass;
patterning the film; and
bonding the cover glass on which the film is formed and an image pickup device, by filling a transparent resin between the cover glass and the image pickup device, wherein the film is configured to cover an entire area of the transparent resin within a pixel region, and wherein the film is not provided at a portion other than the pixel region.

7. The method according to claim 6, wherein the film is formed to have a thickness that satisfies the following Expression:

$$AX+BY \geq C \text{ (in } \mu m\text{)}$$

where the thickness of the film is A in μm, a thickness of the transparent resin is B in μm, the specific gravity of the film is X, a specific gravity of the transparent resin is Y, and a distance between the cover glass and an imaging surface of the image pickup device is C, wherein the distance is calculated as a distance at which an influence of the alpha ray based on a range of the alpha ray emitted from uranium contained in the cover glass is reduced.

8. The method according to claim 6, wherein patterning the film includes removing the film at a portion corresponding to a scribing line after forming the film on the cover glass.

9. The method according to claim 6, wherein the film is formed at a temperature of about 400 degrees centigrade or higher.

10. An electronic apparatus provided with a semiconductor device and a signal processing section, wherein the signal processing section is configured to process a pixel signal outputted from the semiconductor device, the semiconductor device comprising:
an image pickup device;
a cover glass, wherein the image pickup device and the cover glass are bonded to one another;
a film provided between the image pickup device and the cover glass, wherein the film has a specific gravity value of two or more and is configured to shield an alpha ray that arises from the cover glass; and
a transparent resin filled between the image pickup device and the cover glass,
wherein the film is configured to cover an entire area of the transparent resin within a pixel region, and wherein the film is not provided at a portion other than the pixel region.

11. The electronic apparatus according to claim 10, wherein the portion at which the film is not provided includes a scribing line portion.

12. The electronic apparatus according to claim 10, further comprising a through electrode, wherein the portion at which the film is not provided includes a portion in the vicinity of a location of the through electrode.

13. The electronic apparatus according to claim 10, wherein the cover glass and the image pickup device are bonded such that a distance between the cover glass and an imaging surface of the image pickup device is based on the determined specific gravity of the film and a specific gravity of the transparent resin.

14. The electronic apparatus according to claim 10, wherein the film that has the specific gravity of two or more is an oxide film.

15. The electronic apparatus according to claim 10, wherein the film has a seam partially on the cover glass.

16. The electronic apparatus according to claim 10, further comprising:
a fixing member between the image pickup device and the cover glass.

17. The electronic apparatus according to claim 16, wherein the image pickup device is bonded to the cover glass by the fixing member.

18. The electronic apparatus according to claim 16, wherein the fixing member is a transparent resin.

19. The electronic apparatus according to claim 16, wherein the fixing member is a transparent adhesive.

20. The electronic apparatus according to claim 10, wherein the following Expression is satisfied:

$$AX+BY \geq C \text{ (in } \mu m\text{)}$$

where a thickness of the film is A in μm, a thickness of the transparent resin is B in μm, the specific gravity of the film is X, a specific gravity of the transparent resin is Y, and a distance between the cover glass and an imaging surface of the image pickup device is C, wherein the distance is calculated as a distance at which an influence of the alpha ray based on a range of the alpha ray emitted from uranium contained in the cover glass is reduced.

* * * * *